US008921898B1

(12) United States Patent
Chan et al.

(10) Patent No.: US 8,921,898 B1
(45) Date of Patent: Dec. 30, 2014

(54) DEVICE INCLUDING AN ARRAY OF MEMORY CELLS AND WELL CONTACT AREAS, AND METHOD FOR THE FORMATION THEREOF

(71) Applicant: GLOBALFOUNDRIES Inc., Grand Cayman (KY)

(72) Inventors: Nigel Chan, Dresden (DE); Michael Otto, Weinboehla (DE)

(73) Assignee: GLOBALFOUNDRIES Inc., Grand Cayman (KY)

( * ) Notice: Subject to any disclaimer, the term of this patent is extended or adjusted under 35 U.S.C. 154(b) by 35 days.

(21) Appl. No.: 13/920,780

(22) Filed: Jun. 18, 2013

(51) Int. Cl.
*H01L 27/118* (2006.01)
*H01L 27/11* (2006.01)

(52) U.S. Cl.
CPC .................... *H01L 27/1104* (2013.01)
USPC ........... 257/206; 257/210; 257/211; 438/128; 438/129

(58) Field of Classification Search
USPC .................. 257/206, 210, 211; 438/128, 129
See application file for complete search history.

(56) References Cited

U.S. PATENT DOCUMENTS

| 7,368,767 | B2 * | 5/2008 | Kinoshita et al. | 257/202 |
| 7,456,447 | B2 * | 11/2008 | Tatsumi | 257/207 |
| 8,059,452 | B2 * | 11/2011 | Liaw | 365/154 |

* cited by examiner

*Primary Examiner* — Minh-Loan Tran
(74) *Attorney, Agent, or Firm* — Amerson Law Firm, PLLC

(57) ABSTRACT

A device includes an array of a plurality of memory cells, at least one N-well contact area and at least one P-well contact area. The memory cells are arranged in a plurality of rows and a plurality of columns. Each column includes an N-well region and at least one P-well region. The N-well and P-well regions extend between a first end of the column and a second end of the column. Each N-well contact area electrically contacts at least one of the N-well regions, wherein the N-well region of at least one of the columns is electrically contacted at only one of the first and second ends of the column. Each P-well contact area electrically contacts at least one of the P-well regions, wherein the P-well region of at least one of the columns is electrically contacted at only one of the first and second ends of the column.

20 Claims, 8 Drawing Sheets

DEVICE INCLUDING AN ARRAY OF MEMORY CELLS AND WELL CONTACT AREAS, AND METHOD FOR THE FORMATION THEREOF

BACKGROUND OF THE INVENTION

1. Field of the Invention

Generally, the present disclosure relates to the field of integrated circuits, and, more particularly, to integrated circuits including static random access memory devices.

2. Description of the Related Art

Types of semiconductor memory include dynamic random access memory (DRAM) and static random access memory (SRAM). DRAM includes memory cells having a relatively simple structure, in particular memory cells wherein an amount of charge stored in a capacitor is used to represent a bit of information. Due to the simple structure of DRAM cells, a high density of integration may be obtained. However, due to leakage currents in the capacitors, DRAM typically requires constant refresh cycles to avoid a loss of information.

In SRAM devices, cross-coupled inverters are used for storing information. In SRAM devices, refresh cycles need not be performed, and they typically allow a greater speed of operation than DRAM devices. However, SRAM includes memory cells which typically have a more complex structure than the memory cells of DRAM devices, which may limit the density of integration that may be obtained in SRAM devices.

SRAM devices include an array of SRAM cells, wherein each SRAM cell can store one bit of information. The SRAM cells in the array are arranged in a plurality of rows and a plurality of columns. The SRAM cells may be accessed by means of wordlines, bitlines and inverse bitlines, wherein the wordlines can extend along the rows of the array of SRAM cells, and the bitlines and inverse bitlines can extend along the columns.

Possible circuit configurations of SRAM cells include a six transistor SRAM cell configuration, wherein each SRAM cell includes two cross-coupled inverters, each inverter including a pull-up transistor, that typically is a P-channel field effect transistor, and a pull-down transistor, that typically is an N-channel field effect transistor. Additionally, each SRAM cell can include two access transistors which are used for electrically connecting the cross-coupled inverters to a bitline and an inverse bitline extending along the column of the array of SRAM cells, wherein the SRAM cell is provided when a wordline signal is applied to the wordline extending along the row of the array of SRAM cells wherein the SRAM cell is provided. Typically, the access transistors are N-channel field effect transistors. Thus, each SRAM cell includes two P-channel field effect transistors and four N-channel field effect transistors.

The P-channel field effect transistors may be formed in N-well regions of the SRAM device that include a semiconductor material that is doped with an N-type dopant. A P-type dopant may be implanted into the source and drain regions of the P-channel transistors, whereas the N-type doping of the N-well region is maintained in the channel regions of the P-channel transistors. The N-channel transistors may be formed in P-well regions of the SRAM device that include a semiconductor material that is doped with a P-type dopant. Source and drain regions of the N-channel transistors may be doped with an N-type dopant, and the P-type doping of the P-well region may be maintained in the channel regions of the N-channel transistors.

The P-well regions and the N-well regions may extend along the columns of the array of SRAM cells. At the ends of the columns of the array of SRAM cells, electrical connections to the P-wells and N-wells may be provided, to which a body voltage of transistors formed in the P-well region and the N-well region is applied. Typically, the body voltage may be approximately equal to the voltage applied to the source regions of the transistors. Thus, a low voltage power supply voltage (for example, Vss) is applied to the P-wells wherein the N-channel transistors are provided, and a high voltage power supply voltage (for example, Vdd) is applied to the N-wells wherein the P-channel transistors are provided.

For providing the electrical connections to the P-well regions and the N-well regions, edge cells may be provided at each of the ends of the columns of the array of SRAM cells. In conventional SRAM devices, there is typically one type of edge cell. At each end of each column of the array of SRAM cells, one of the edge cells is provided. Each edge cell includes both an electrical contact to the P-well region of the column and an electrical contact to the N-well region of the column. Accordingly, the P-well regions and N-well regions of the columns of the array of SRAM cells are electrically contacted at both ends.

Since different voltages are applied to the P-well contacts and the N-well contacts, the edge cells include an electrical insulation between the P-well and N-well contacts that may be provided, for example, in the form of a shallow trench isolation structure. Accordingly, the edge region of the SRAM device wherein the edge cells are provided includes sufficient space for the shallow trench isolation structures between the P-well and N-well contacts. For a defined dimension of the edge region, this may limit the size of P-well and N-well contacts, which has an influence on the contact resistance.

As the active area of the P-well and N-well contacts is scaled, a segregation of dopants may occur. In particular, boron, which may be employed as a P-type dopant in the P-well regions and the P-well contacts, may diffuse into shallow trench isolation regions including silicon dioxide. This can lead to an increased contact resistance of the well contacts. Possibilities to address this issue by increasing a dopant dose may be limited since, typically, the well contact regions are doped in a same process step as other portions of the SRAM device such as, for example, well regions and/or source and drain regions of transistors. Thus, there are limited possibilities for optimizing the doping of the well contacts for low contact resistance.

Accordingly, providing a sufficiently low contact resistance of well contacts in conventional SRAM devices can be an issue.

In view of the situation described above, the present disclosure provides devices and methods that can help to substantially avoid or at least reduce the above-mentioned issue.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

An illustrative device disclosed herein includes an array of a plurality of memory cells, at least one N-well contact area and at least one P-well contact area. The memory cells of the array of memory cells are arranged in a plurality of rows and a plurality of columns. Each column includes an N-well region and at least one P-well region. The N-well region and the at least one P-well region extend between a first end of the column and a second end of the column. Each N-well contact area electrically contacts at least one of the N-well regions. The N-well region of at least one of the columns is electrically contacted at only one of the first end and the second end of the column. Each P-well contact area electrically contacts at least one of the P-well regions. Each of the at least one P-well region of at least one of the columns is electrically contacted at only one of the first end and the second end of the column.

Another illustrative device disclosed herein includes an array of a plurality of static random access memory cells, an N-well contact area and a P-well contact area. The static random access memory cells of the array of memory cells are arranged in a plurality of rows and a plurality of columns. Each column includes an N-well region, a first P-well region and a second P-well region. The first and second P-well regions are arranged on opposite sides of the N-well region and spaced apart along a direction of the rows of the array. The N-well contact area is provided at a first end of the columns of the array. The N-well contact area includes a contiguous N-doped semiconductor region. The P-well contact area is provided at a second end of the columns of the array. The P-well contact area includes a contiguous P-doped semiconductor region. The N-well region of each of the columns of the array is electrically connected to the N-well contact area. The first P-well region and the second P-well region of each of the columns of the array are electrically connected to the P-well contact area.

An illustrative method disclosed herein includes forming an array of a plurality of memory cells. The memory cells are arranged in a plurality of rows and a plurality of columns. Each column includes an N-well region and at least one P-well region. The N-well region and the at least one P-well region extend between a first end of the column and a second end of the column. At least one N-well contact area is formed. Each N-well contact area electrically contacts at least one of the N-well regions. The N-well region of at least one of the columns is electrically contacted at only one of the first end and the second end of the column. At least one P-well contact area is formed. Each P-well contact area electrically contacts at least one of the P-well regions. Each of the at least one P-well region of at least one of the columns is electrically contacted at only one of the first end and the second end of the column.

BRIEF DESCRIPTION OF THE DRAWINGS

The disclosure may be understood by reference to the following description taken in conjunction with the accompanying drawings, in which like reference numerals identify like elements, and in which.

Figure 1:
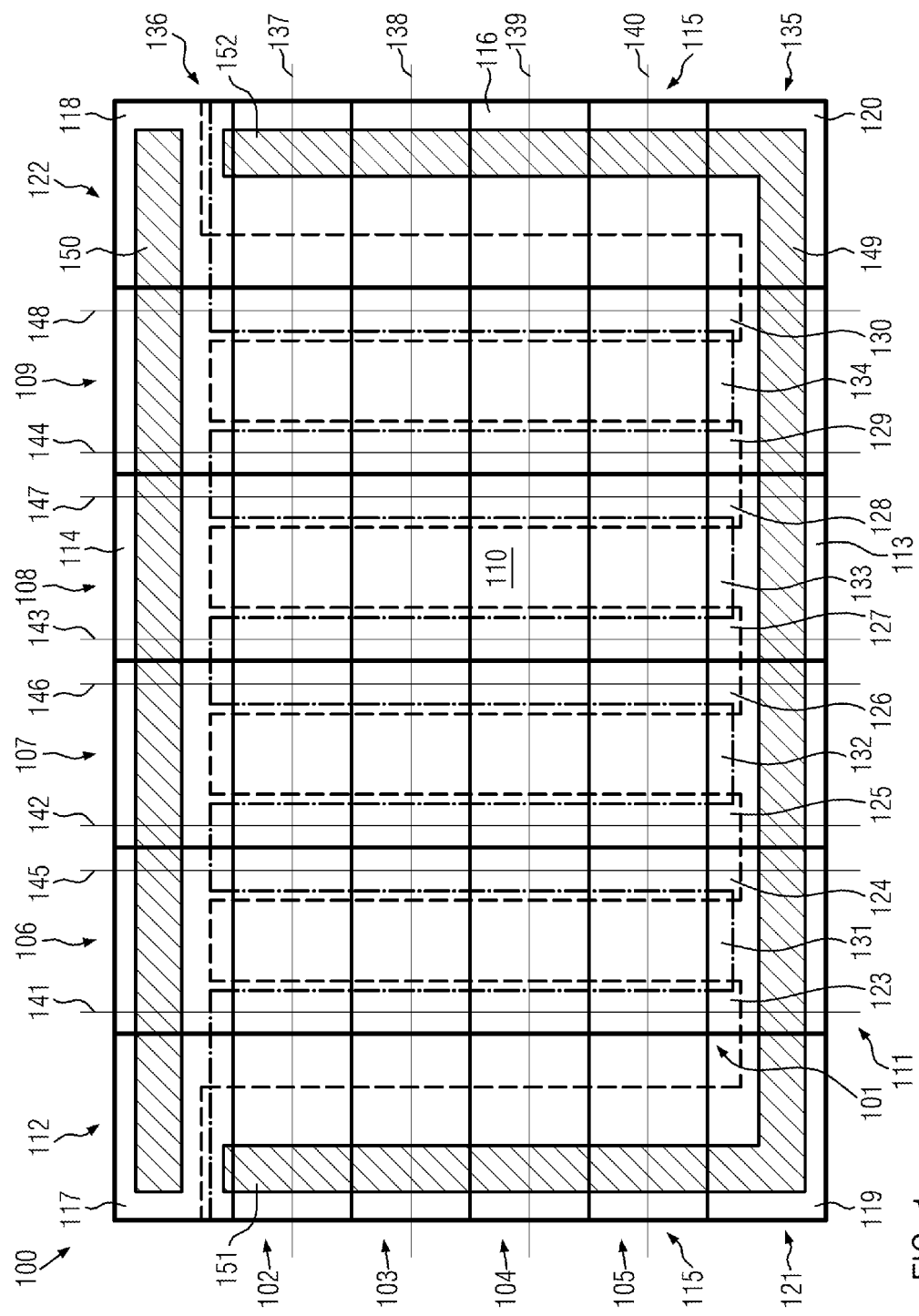
FIG. 1 schematically illustrates a device according to an embodiment.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

The present disclosure provides devices including a plurality of memory cells, in particular, static random access memory cells, wherein an active area size of P-well and N-well contacts may be increased while maintaining a small layer footprint. Devices as disclosed herein may be used, in particular, in highly scaled technologies.

In embodiments disclosed herein, a comb-like well contact layout wherein well regions are electrically contacted at only one end thereof is employed to increase the available active area for the well contacts and/or to reduce the contact resistance as compared to conventional devices as described above for the same area of the device. In other embodiments, the area for the well contacts may be reduced while maintaining substantially the same well contact resistance as in conventional devices.

In embodiments disclosed herein, two different types of edge cells are used, one for P-well contacts and one for N-well contacts. Thereby, the requirement of having a boundary between a P-well contact and an N-well contact within the edge cells may be removed, which may help to reduce the area required for providing electrical insulation between the P-well contacts and the N-well contacts.

In some embodiments, edge cells of a first type may be provided at a first side of the array of memory cells, and edge cells of a second type may be used at a second side of the array, wherein the first and second sides of the array are at opposite ends of the columns of the array of memory cells. In other embodiments, edge cells of both types may be interleaved at both sides of the array.

FIG. 1 schematically illustrates a static random access memory (SRAM) device 100 according to an embodiment. The SRAM device 100 includes an array 101 of SRAM memory cells, wherein one of the memory cells of the array 101 of memory cells is denoted by reference numeral 110. The memory cells of the array 101 of memory cells are arranged in a plurality of rows 102, 103, 104, 105 and columns 106, 107, 108, 109. For example, the memory cell 110 is located in row 104 and column 108 of the array 101 of memory cells.

The rows 102 to 105 of the array 101 of memory cells extend substantially along a row direction of the array 101 of memory cells (horizontal in the view of FIG. 1). The columns 106 to 109 extend substantially along a column direction (vertical in the view of FIG. 1), wherein the column direction is perpendicular to the row direction.

Each of the columns 106 to 109 of the array 101 of memory cells includes an N-well region. In FIG. 1, reference numeral 131 denotes the N-well region of column 106, reference numeral 132 denotes the N-well region of column 107, reference numeral 133 denotes the N-well region of column 108 and reference numeral 134 denotes the N-well region of column 109. In FIG. 1, boundaries of the N-well regions 131 to 134 are schematically denoted by dashed lines. The N-well regions 131 to 134 can extend along the column direction of the array 101 of memory cells and can be located at a center of the respective column wherein they are provided, so that the N-well regions 131 to 134 are spaced apart from boundaries between the memory cells in the column wherein the respective N-well region is provided and memory cells in adjacent columns.

Each of the columns 106 to 109 of the array 101 of memory cells further includes a first P-well region and a second P-well region. In FIG. 1, reference numeral 123 denotes the first P-well region of column 106, reference numeral 125 denotes the first P-well region of column 107, reference numeral 127 denotes the first P-well region of column 108 and reference numeral 129 denotes the first P-well region of column 109. Reference numeral 124 denotes the second P-well region of column 106, reference numeral 126 denotes the second P-well region of column 107, reference numeral 128 denotes the second P-well region of column 108 and reference numeral 130 denotes the second P-well region of column 109.

In each of the columns 106 to 109 of the array 101 of memory cells, the first P-well region and the second P-well region of the respective column may be arranged on opposite sides of the N-well region of the column. Accordingly, the first and second P-well regions are arranged between the N-well region and boundaries between the memory cells in the column and memory cells in neighboring columns. First and second P-well regions in neighboring columns of the array 101 of memory cells may be arranged directly adjacent each other and/or may be contiguous with each other, so that the second P-well region in a first one of the columns 106 to 109 and the first P-well region in a second one of the columns 106 to 109 form a contiguous P-well region between the N-well regions of the first and the second one of the columns 106 to 109. Accordingly, the second P-well region 124 of the column 106 and the first P-well region 125 of the column 107 may be contiguous, the second P-well region 126 of the column 107 and the first P-well region 127 of the column 108 may be contiguous, and the second P-well region 128 of the column 108 and the first P-well region 129 of the column 109 may be contiguous.

As will be detailed below, each of the memory cells of the array 101 of memory cells may include a plurality of semiconductor regions provided in the N-well regions 131 to 134 and the P-well regions 123 to 130 wherein source, drain and channel regions of transistors are formed, and wherein trench isolation regions provide electrical insulation between source and drain regions of different transistors. The N-well regions 131 to 134 and the P-well regions 123 to 130 may have a greater depth than the trench isolation regions and may extend below the trench isolations, so that a body potential may be applied to each of the channel regions by means of the N-well regions 131 to 134 and the P-well regions 123 to 130. Electrical insulation between N-well and P-well regions may be provided by the PN transition therebetween, which is biased in the reverse direction in the operation of SRAM device 100.

The N-well regions 131 to 134 extend between opposite ends of the columns 106 to 109 of the array 101 of memory cells. The first ends of the columns 106, 107, 108, 109 are located at a first side 135 of the array 101 of memory cells, and the second ends of the columns 106, 107, 108, 109 are located at a second side 136 of the array 101 of memory cells.

The device 100 may further include a plurality of wordlines 137, 138, 139, 140. Each of the wordlines 137 to 140 is associated with one of the rows 102 to 105 of the array 101 of memory cells and extends along the respective row in the row direction. Moreover, the device 100 may include a plurality of bitlines 141, 142, 143, 144. Each of the bitlines 141 to 144 is associated with one of the columns 106 to 109 of the array 101 of memory cells and extends along the respective column in the column direction. Furthermore, the device 100 may include a plurality of inverse bitlines 145, 146, 147, 148. Each of the inverse bitlines 145 to 148 is associated with one of the columns 106 to 109 of the array 101 of memory cells and extends along the respective column in the column direction. In some embodiments, the bitlines 141 to 144 may be located above the first P-well regions 123, 125, 127, 129, and the inverse bitlines 145 to 148 may be located above the second P-well regions 124, 126, 128, 130. In other embodiments, the inverse bitlines 145 to 148 may be located above the first P-well regions 123, 125, 127, 129, and the bitlines 141 to 144 may be located above the second P-well regions 124, 126, 128, 130.

The wordlines 137 to 140, the bitlines 141 to 144 and the inverse bitlines 145 to 148 may be electrically connected to a control circuit (not shown) that may have features corresponding to control circuits of conventional SRAM devices and which can apply signals to the wordlines 137 to 140, bitlines 141 to 144 and inverse bitlines 145 to 148 for reading data from the memory cells of the array 101 of memory cells and/or for writing data to the memory cells of the array 101.

Figure 2:
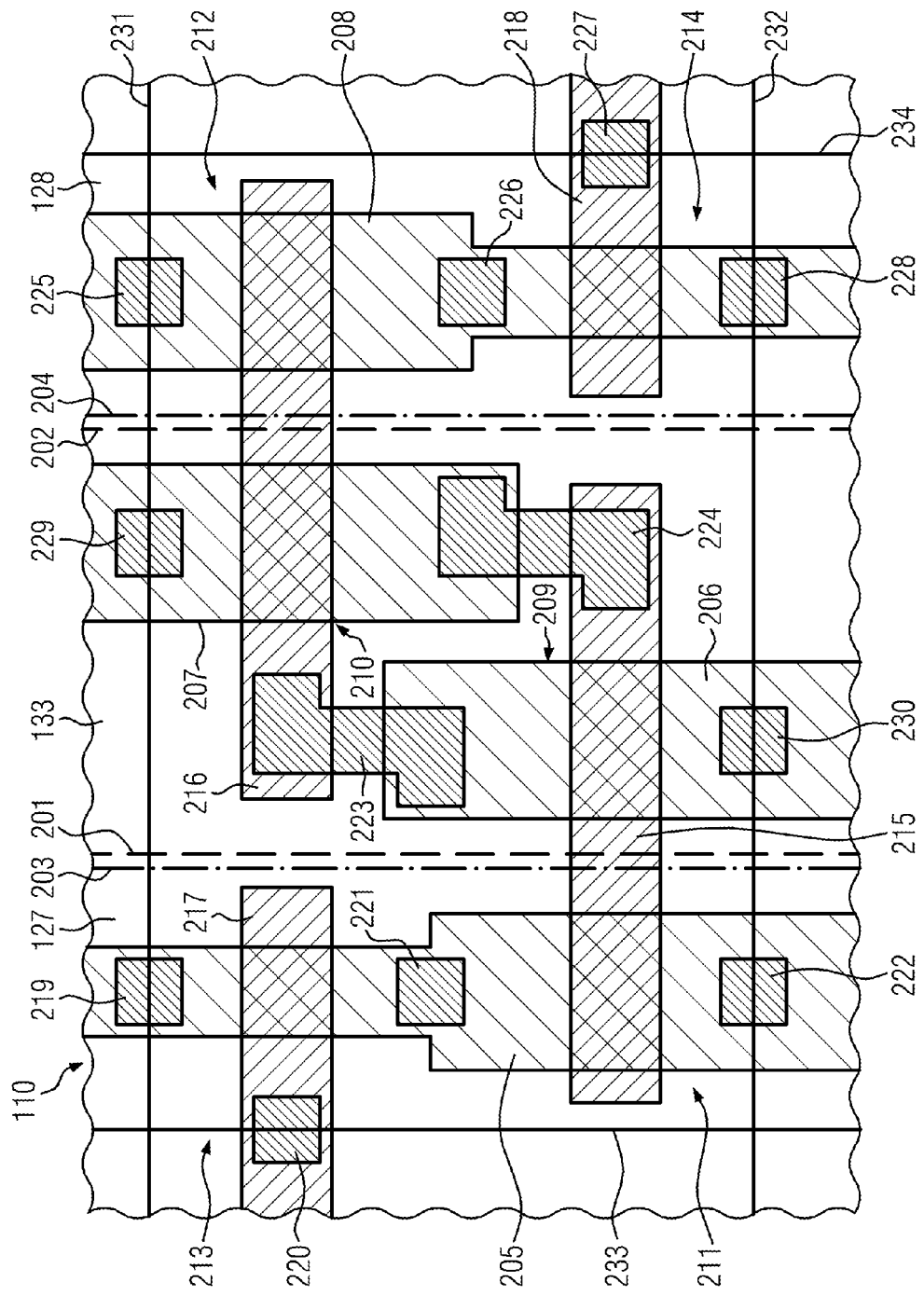
FIG. 2 shows a schematic enlarged view of an SRAM cell of the device shown in FIG. 1.

FIG. 2 shows a schematic view of a circuit layout of SRAM cell 110 in row 104 and column 108 of the array 101 of memory cells. Lines 231 to 234 denote boundaries between the memory cell 110 and adjacent memory cells.

The memory cell 110 includes a first pull-up transistor 209 and a second pull-up transistor 210. The pull-up transistors 209, 210 may be P-channel field effect transistors. Source, drain and channel regions of the pull-up transistors 209, 210 may be provided in semiconductor regions 206, 207 that are provided in the N-well region 133 of the column 108 of the array 101 of memory cells wherein the memory cell 110 is provided. Gate electrodes of the pull-up transistors 209, 210 may be provided by portions of electrically conductive lines 215, 216 that may be formed of an electrically conductive material such as, for example, doped polysilicon and/or one or more metals, and may be separated from the semiconductor regions 206, 207 by gate insulation layers (not shown) formed of an electrically insulating material, for example silicon dioxide and/or a high-k material such as, for example, hafnium dioxide.

Channel regions of the pull-up transistors 209, 210, which are provided below the electrically conductive lines 215, 216 may be N-doped, in accordance with the doping of the N-well region 133. Source and drain regions of the pull-up transistors 209, 210 which are provided adjacent the electrically conductive lines 215, 216 may be P-doped.

The memory cell 110 may further include pull-down transistors 211, 212, source, drain and channel regions of which are provided in semiconductor regions 205, 208. The semiconductor region 205 may be provided in the first P-well region 127 of the column 108 of the array 101 of memory cells wherein the memory cell 110 is provided, and the semiconductor region 208 may be provided in the second P-well region 128 of the column 108.

In addition to the pull-down transistors 111, 112, access transistors 213, 214 may be provided, source/drain and channel regions of which may be provided in the semiconductor regions 205, 208.

Gate electrodes of the pull-down transistors 211, 212 may be provided by portions of the electrically conductive lines 215, 216 extending across the semiconductor regions 205, 208. Gate electrodes of the access transistors 213, 214 may be provided by portions of electrically conductive lines 217, 218 extending across the semiconductor regions 205, 208.

Channel regions of the pull-down transistors 211, 212 and the access transistors 213, 214 which are located below the electrically conductive lines 215, 216, 217, 218 may be P-doped, in accordance with the doping of the P-well regions 127, 128. Source and drain regions of the pull-down transistors 211, 212 and source/drain regions of the access transistors 213, 214 which are located in portions of the semiconductor regions 205, 208 adjacent the electrically conductive lines 215, 216, 217, 218 may be N-doped.

In FIG. 2, dashed line 201 denotes a location of the boundary between the first P-well region 127 and the N-well region 133, and dashed line 202 denotes a location of the boundary between the N-well region 133 and the second P-well region 128. Dashed lines 203, 204 denote locations of boundaries between a block-N region and a block-P region, wherein the block-N region is located to the left of dashed line 203 and to the right of the dashed line 204. The block-P region is located between the dashed lines 203, 204. Portions of the block-N region within the memory cell 110 may be at substantially the same location as portions of the P-well regions 127, 128 within the memory cell 110, and portions of the block-P region within the memory cell 110 may be at substantially the same location as portions of the N-well region 133 within the memory cell 110.

After the formation of the electrically conductive lines 215 to 218, a relatively high dose of an N-type dopant may be implanted into the block-N regions for doping the source and drain regions of the pull-down transistors 211, 212 and the access transistors 213, 214. A relatively high dose of a P-type dopant may be implanted into the block-P region after the formation of the electrically conductive lines 215 to 218 for doping the source and drain regions of the pull-up transistors 209, 210. During the implantation of the N-type dopant, the block-P region may be covered by a mask, for example a photoresist mask, and the block-N region may be covered by a mask, for example a photoresist mask, during the implantation of the P-type dopant.

Between the semiconductor regions 205, 206, 207, 208, an isolation structure, for example a trench isolation structure, may be provided.

Whereas, in the array 101 of memory cells, the block-P regions are at substantially the same locations as the N-well regions, and the block-N regions are at substantially the same locations as the P-well regions, in portions of the device 100 outside the array 101 of memory cells, the location of the block-N region may be different from the location of the P-well regions, and the location of the block-P regions may be different from the location of the N-well regions.

The memory cell 110 further includes contact structures 219 to 230. Of these contact structures, contact structures 221, 223, 224, 226 are located within the memory cell 110. Contact structures 219, 220, 222, 225, 227, 228, 229, 230 are located at the boundaries of the memory cell 110 and may be shared between the memory cell 110 and adjacent memory cells.

Contact structures 220, 227 may provide an electrical connection between the electrically conductive lines 217, 218 that provide the gate electrodes of the access transistors 213, 214 and the wordline 139 associated with the row 104 of the array 101 of memory cells wherein the memory cell 110 is provided. Contact structure 219 may provide an electrical connection between a first source/drain region of the access transistor 213 and the bitline 143 associated with the column 108 of the array 101 of memory cells wherein the memory cell 110 is provided, and contact structure 228 may provide an electrical connection between a first source/drain region of the access transistor 214 and the inverse bitline 147 associated with the column 108 of the array 101 of memory cells.

Contact structure 223 may provide an electrical connection between the electrically conductive line 216 and the drain region of the pull-up transistor 209, and the contact structure 224 may provide an electrical connection between the electrically conductive line 215 and the drain region of the pull-up transistor 210. The contact structures 221, 223 may be electrically connected with each other by a metallization line (not shown) provided in an interlayer dielectric (not shown) that is deposited above the device 100, and the contact structures 224, 226 may also be electrically connected by a metallization line. Thus, an electrical connection between the drain region of the pull-up transistor 209, a second source/drain region of the access transistor 213 and the drain region of the pull-down transistor 211, as well as an electrical connection between the drain region of the pull-up transistor 210, a second source/drain region of the access transistor 214 and the drain region of the pull-down transistor 208 may be provided.

Contact structures 229, 230 may provide an electrical connection between source regions of the pull-up transistors 209, 210 and a high voltage power supply of the device 100, and contact structures 222, 225 may provide an electrical connection between source regions of the pull-down transistors 211, 212 and a low voltage power supply of the device 100.

Further features of the memory cell 110 may correspond to those of conventional static random access memory cells.

Other memory cells of the array 101 of memory cells may have a configuration generally corresponding to the configuration of the memory cell 110 wherein, however, adjacent memory cells may be mirror-symmetrical with respect to each other. In particular, memory cells in adjacent rows of the array 101 of memory cells may be mirror-symmetrical with respect to each other, with an axis of symmetry extending parallel to the direction of the rows 102 to 105 of the array 101 of memory cells, and memory cells in adjacent columns may be mirror-symmetrical with respect to each other, with an axis of symmetry extending parallel to the direction of the columns 106 to 109 of the array 101 of memory cells.

The device 100 may further include an N-well contact area 121 and a P-well contact area 122. The N-well contact area 121 includes an N-doped semiconductor region 149 that is in electrical contact with each of the N-well regions 131 to 134 of the columns 106 to 109 of the array 101 of memory cells. The N-doped semiconductor region 149 is located adjacent the first ends of the columns 106 to 109 of memory cells at the first side 135 of the array 101 of memory cells.

Additionally, the N-well contact area 121 may include a first boundary semiconductor region 151 and a second semiconductor region 152 which are located adjacent the first column 106 and the last column 109 of the array 101 of memory cells.

The N-doped semiconductor region 149 and the boundary semiconductor regions 151, 152 may be located both in the N-well region and in the block-N region of the device 100, so that the N-doped semiconductor region 149 and the boundary semiconductor regions 151, 152 are N-doped. In the formation of the device 100, N-type dopants may be implanted into the N-doped semiconductor region 149 and the boundary semiconductor regions 151, 152 both in ion implantation processes for doping the N-well regions 131 to 134 and in ion implantation processes performed for doping the block-N regions, so that a relatively high concentration of N-type dopant may be provided in the N-doped semiconductor region 149 and the boundary semiconductor regions 151, 152. Thus, a relatively high N-type conductivity of the N-doped semiconductor region 149 and the boundary semiconductor regions 151, 152 may be provided.

The device 100 may further include a P-well contact area 122 that is provided at the second side 136 of the array 101 of memory cells that is opposite the first side 135 of the array 101 of memory cells. The P-well contact area 122 may include a P-doped semiconductor region 150 that is in electrical contact with each of the P-well regions 123 to 130 of the array 101 of memory cells.

The P-doped semiconductor region 150 may be located both in the P-well regions and in the block-P region of the device 100, so that P-type dopant is implanted into the P-doped semiconductor region 150 both in an ion implantation process that is performed for doping the P-well regions 123 to 130 of the array 101 of memory cells and in an ion implantation process wherein a P-type dopant is implanted into the block-P region. Thus, a relatively high P-type conductivity of the P-doped semiconductor region 150 may be obtained.

The P-doped semiconductor region 150 electrically contacts the P-well regions 123 to 130 of the array 101 of memory cells at second ends of the columns 106 to 109 of the array 101 of memory cells that are at the second side 136 of the array 101 of memory cells.

Accordingly, the N-well regions 131 to 134 of the columns 106 to 109 are electrically contacted by the N-well contact area 121 only at first ends of the columns 106 to 109 which are located at the first side 135 of the array 101 of memory cells, and the P-well regions 123 to 130 of the columns 106 to 109 are electrically contacted by the P-well contact area 122 only at second ends of the columns 106 to 109 which are located at the second side 136 of the array 101 of memory cells.

The N-doped semiconductor region 149 may provide a contiguous N-doped semiconductor region at the first ends of the columns 106 to 109, and the P-doped semiconductor region 150 may provide a contiguous P-doped semiconductor region at the second ends of the columns 106 to 109. Additionally, the boundary semiconductor regions 151, 152 may be contiguous with the N-doped semiconductor region 149.

The N-well contact area 121 may be provided by a plurality of first edge cells 111 which are provided at the first side 135 of the array 101 of memory cells. An extension of each of the first edge cells 111 in the row direction may be approximately equally to an extension of the memory cells in the row direction, so that one of the first edge cells 111 is associated with each of the columns 106 to 109 of the array 101 of memory cells, and each of the memory cells at the first ends of the columns 106 to 109 abuts one of the first edge cells 111.

In FIG. 1, reference numeral 113 denotes one of the first edge cells 111. A schematic enlarged view of the circuit layout of the first edge cell 113 is shown in FIG. 3.

Figure 3:
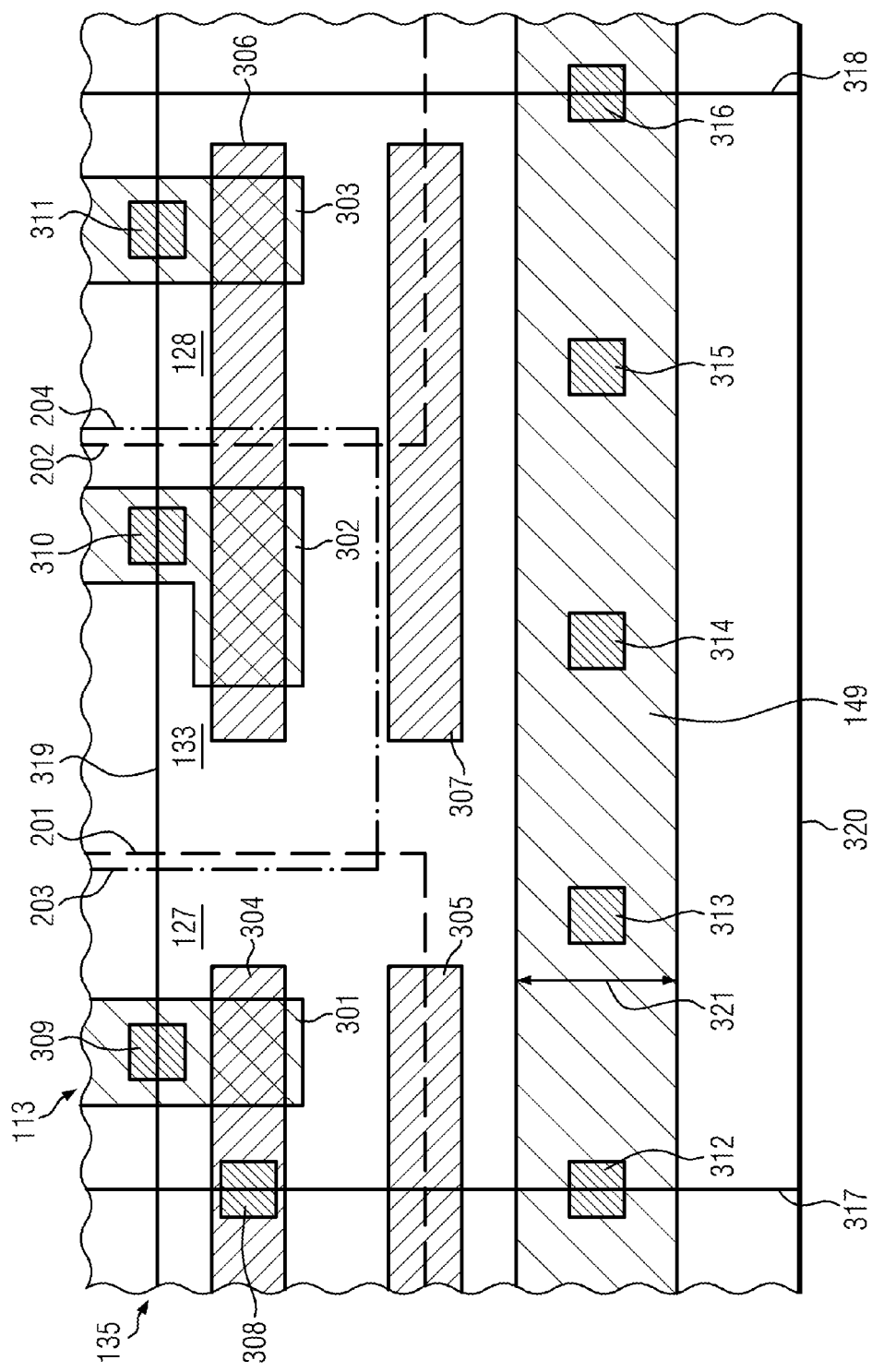
FIG. 3 shows a schematic enlarged view of an edge cell of a first type of the device shown in FIG. 1.

In FIG. 3, lines 317, 318 denote boundaries between the first edge cell 113 and adjacent ones of the plurality of edge cells 111. Line 319 denotes a boundary between the first edge cell 113 and an adjacent memory cell of the array 101 of memory cells (being the memory cell in row 105 and column 108). Reference numeral 320 denotes a boundary of the device 100.

The first edge cell 113 includes contact structures 309, 310, 311, which may be shared between the first edge cell 113 and the adjacent memory cell. The contact structure 309 may provide an electrical connection between a semiconductor region 301 wherein an access transistor of the adjacent memory cell is formed and the bitline 143 of the column 108 of the array 101 of memory cells associated with the edge cell 113. The contact structure 310 may provide an electrical connection between a semiconductor region 302 wherein a pull-up transistor of the adjacent memory cell is formed and a high voltage power supply of the device 100, and contact structure 311 may provide an electrical connection between a semiconductor region 303 wherein a pull-down transistor of the adjacent memory cell is provided with a low voltage power supply of the device 100. As shown in FIG. 3, the semiconductor regions 301, 302, 303 may extend into the first edge cell 113.

The N-doped semiconductor region 149 may be in electrical connection with the N-well region 133 of the column 108. Portions of the N-doped semiconductor material of the N-well region 133 may extend below a trench isolation structure arranged between the semiconductor region 302 and the N-doped semiconductor region 149, providing an electrically conductive path between the N-well region 133 and the N-doped semiconductor region 149.

The first edge cell 113 may further include contact structures 312, 313, 314, 315, 316. The contact structures 312, 316 may be shared between the first edge cell 113 and adjacent ones of the first edge cells 111, and the contact structures 313, 314, 315 may be within the first edge cell 113. In other embodiments, a different number of contact structures and/or a different arrangement of contact structures may be provided. The contact structures 312 to 316 may provide an electrical connection between the N-doped semiconductor region 149 and a high voltage power supply of the device 100. For example, the contact structures 312 to 316 may be electrically connected to a metallization line (not shown) that is in electrical connection with a high voltage power supply terminal of the device 100.

Since both the N-doped semiconductor region 149 and the portions of the N-well region 133 wherein the channel regions of the pull-up transistors of the memory cells in the row 108 adjacent to which the first edge cell 113 is provided are N-doped, the N-doped semiconductor region 149 can establish a substantially ohmic connection between the high voltage power supply and the channel regions of the pull-up transistors of the memory cells in column 108, so that an appropriate body voltage is applied to the pull-up transistors.

The first edge cell 113 may further include electrically conductive lines 304, 305, 306, 307 and a contact structure 308, which may be shared between the first edge cell 113 and an adjacent first edge cell. The electrically conductive lines 304 to 307 and the contact structure 308 may be dummy structures providing an environment for the memory cell adjacent the first edge cell 113 that is similar to the environment of a memory cell within the array 101 of memory cells such as, for example, memory cell 110 described above. Thus, deviations between the electrical properties of memory cells close to the boundary of the array 101 of memory cells and memory cells within the array 101 may be substantially avoided or at least reduced.

The other first edge cells of the plurality of first edge cells 111 may have a configuration generally corresponding to that of the first edge cell 113 wherein, however, first edge cells which are directly adjacent each other may be mirror-symmetrical with respect to each other, with an axis of symmetry that is parallel to the direction of the columns 106 to 109 of the array 101 of memory cells.

The N-doped semiconductor region 149 may extend through the first edge cell 113 along the row direction of the array 101 of memory cells, wherein the portions of the N-doped semiconductor region 149 in adjacent ones of the plurality of first edge cells 111 are contiguous. Thus, contiguous N-doped semiconductor region 149 may be provided.

The P-well contact area 122 may be provided by a plurality of second edge cells 112 which are provided at the second side 136 of the array 101 of memory cells. Reference numeral 114 denotes one of the second edge cells 112. Each of the second edge cells 112 may have an extension in the row direction of the array 101 of memory cells that is approximately equal to an extension of the memory cells in the row direction. Thus, each of the second edge cells 112 may be associated with one of the columns 106 to 109 of the array 101 of memory cells. In particular, second edge cell 114 is associated with and adjacent to the column 108 of the array 101 of memory cells.

Figure 4:
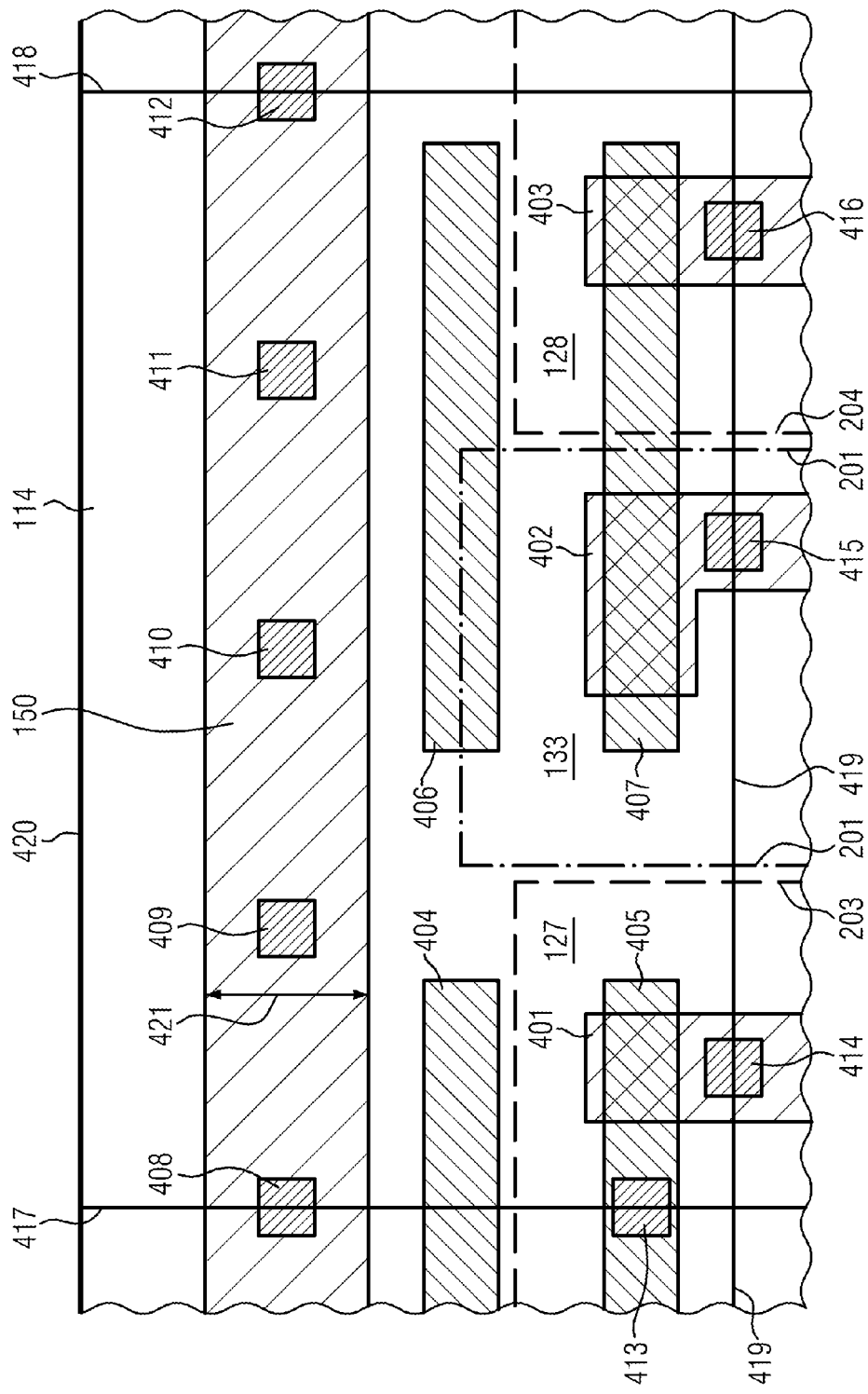
FIG. 4 shows a schematic enlarged view of an edge cell of a second type of the device shown in FIG. 1.

FIG. 4 shows a schematic enlarged view of the circuit layout of the second edge cell 114. Lines 417, 418 denote boundaries between the second edge cell 114 and adjacent ones of the plurality of second edge cells 112. Line 419 denotes a boundary between the second edge cell 114 and an adjacent one of the memory cells of the array 101 of memory cells, which is the memory cell in row 102 and column 108. Line 420 denotes a boundary of the device 100.

The second edge cell 114 includes a plurality of contact structures 408 to 416. Contact structures 414, 415, 416 may be shared between the second edge cell 114 and the memory cell adjacent the second edge cell 114. For example, contact structure 414 may provide an electrical connection between a semiconductor region 401 wherein an access transistor of the memory cell is formed and the bitline 143, contact structure 415 may provide an electrical connection between a semiconductor region 402 wherein a pull-up transistor of the memory cell is formed and a high voltage power supply of the device 100, and contact structure 416 may provide an electrical connection between a semiconductor region 403 wherein a pull-down transistor of the memory cell is provided and a low-voltage power supply of the device 100. As shown in FIG. 4, the semiconductor regions 401, 402, 403 may extend into the second edge cell 114.

The contact structures 408 to 412 may provide an electrical connection between the P-doped semiconductor region 150 and the low-voltage power supply of the device 100. For example, the contact structures 408 to 412 may be connected between the P-doped semiconductor region 150 and a metallization line (not shown) formed in an interlayer dielectric that is electrically connected to the low-voltage power supply. Contact structures 408, 412 may be shared between the second edge cell 114 and adjacent ones of the plurality of second edge cells 112, and contact structures 409 to 411 may be within the second edge cell 114. In other embodiments, different arrangements and/or a different number of contact structures providing an electrical connection to the P-doped semiconductor region 150 may be used.

Portions of the P-well regions 127, 128 of the column 108 of the array 101 of memory cells may be in electrical connection with the P-doped semiconductor region 150. In particular, the semiconductor material of the P-well regions 127, 128 may extend below a trench isolation structure that is located between the semiconductor regions 401, 402, 403 and the P-doped semiconductor region 150, so that the P-doped semiconductor material wherein the channel regions of the pull-down transistors and access transistors of the memory cells in the column 108 of the array 101 of memory cells are formed are in a substantially ohmic electrical connection with the P-doped semiconductor region 150. Thus, an appropriate body voltage may be applied to the channel regions of the pull-down and access transistors of the memory cells in column 108 of array 101 of memory cells.

Similar to the first edge cell 113 described above, the second edge cell 115 may include electrically conductive lines 404, 405, 406, 407 and contact structure 413, which may be dummy structures for providing an environment for the memory cell adjacent the edge cell 114 that is similar to the environment of memory cells within the array 101 of memory cells.

The other second edge cells of the plurality of second edge cells 112 may have a configuration generally corresponding to the configuration of second edge cell 114, wherein, however, directly adjacent ones of the second edge cells 112 may be mirror-symmetrical with respect to each other, with an axis of symmetry extending in a direction parallel to the column direction of the array 101 of memory cells. The P-doped semiconductor region 150 may extend through the plurality of second edge cells 112 in a direction substantially parallel to the row direction of the array 101 of memory cells.

As shown in FIGS. 3 and 4, the first edge cell 113 and the second edge cell 114 need not include an insulation structure separating the N-well contact area 121 and the P-well contact area 122 from each other, since the N-well contact area 121 and the P-well contact area 122 are provided on different sides of the array 101 of memory cells. Therefore, a greater amount of space is available in the first edge cell 113 for the N-doped semiconductor region 149, and, in the second edge cell 114, a greater amount of space is available for the P-doped semiconductor region 150.

In some embodiments, dimensions of the edge cells 113, 114 may be approximately equal to those of edge cells employed in conventional SRAM devices as described above. In such embodiments, the electrical resistance of the well connections provided by the edge cells 113, 114 may be reduced compared to the conventional SRAM devices. In other embodiments, the edge cells 113, 114 may be adapted to provide a contact resistance of the well contacts provided by the edge cells 113, 114 that is substantially equal to that of well contacts in conventional SRAM devices, and the dimensions of the edge cells 113, 114 may be reduced compared to edge cells employed in conventional SRAM devices.

Corresponding considerations apply to the other ones of the first edge cells 111 and the second edge cells 112.

In FIG. 3, reference numeral 321 denotes a width of the N-doped semiconductor region 149, being an extension of the N-doped semiconductor region 149 in the column direction of the array 101 of memory cells, and in FIG. 4, reference numeral 421 denotes a width of the P-doped semiconductor region 150, being an extension of the P-doped semiconductor region 150 in the column direction of the array 101 of memory cells.

The N-doped semiconductor region 149 may have a width 321 in a range from about 30-300 nm. The P-doped semiconductor region 150 may have a width 421 in a range from about 30-300 nm.

The device 100 may further include boundary cells 115 which are provided at the ends of the rows 102 to 105 of the array 101 of memory cells and which provide the boundary semiconductor regions 151, 152. Each of the boundary cells 115 may have an extension in the column direction of the array 101 of memory cells approximately equal to the extensions of the memory cells in the column direction, and one of the boundary cells 115 may be associated with each end of each of the rows 102 to 105 of the array 101 of memory cells.

Figure 5:
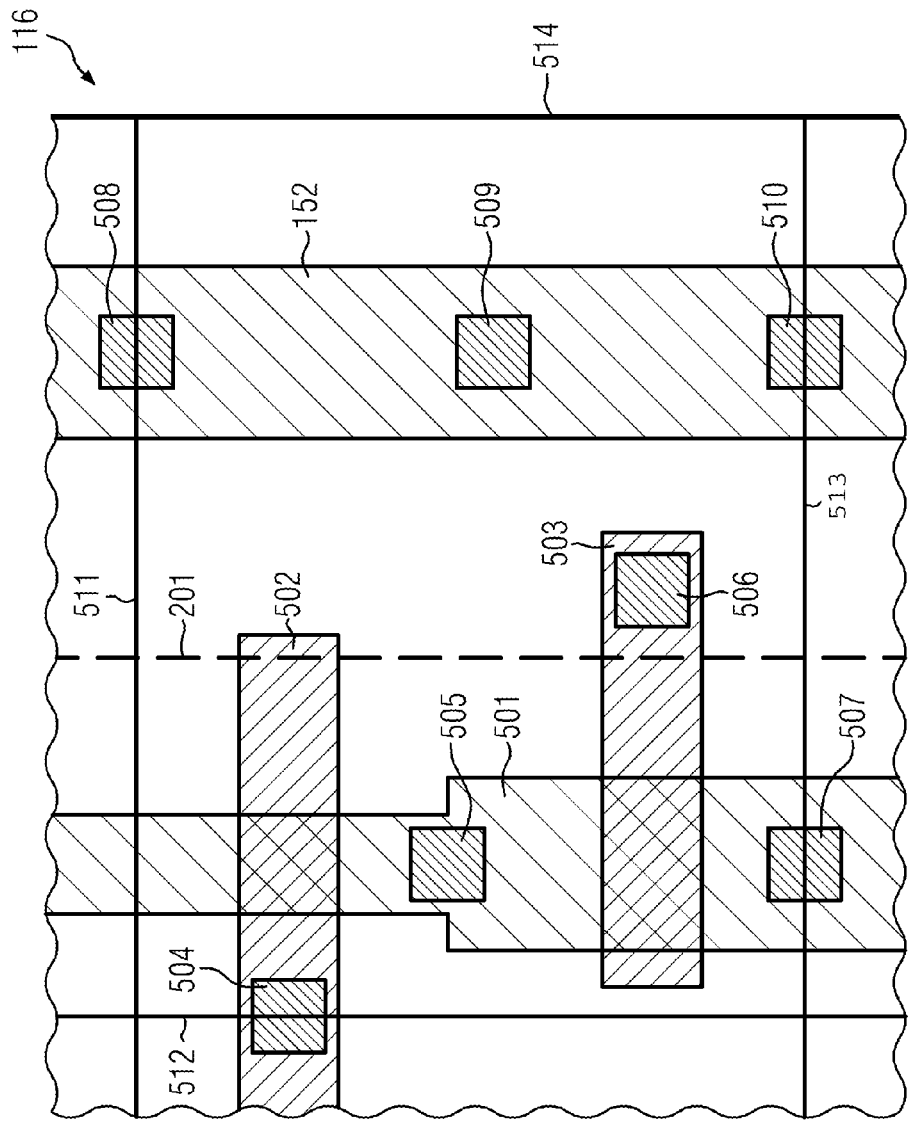
FIG. 5 shows a schematic enlarged view of a boundary cell of the device shown in FIG. 1.

FIG. 5 shows an enlarged view of one boundary cell 116 of the plurality of boundary cells 115. The boundary cell 116 may include a portion of the boundary semiconductor region 152 and contact structures 508, 509, 510 providing an electrical connection between the boundary semiconductor region 152 and the high voltage power supply of the device 100, similar to contact structures 312 to 316 of the first edge cell 113. Contact structure 509 may be provided within the boundary cell 116, and contact structures 508, 510 may be shared between adjacent boundary cells. In other embodiments, a different number of contact structures and/or a different arrangement of the contact structures may be used.

Additionally, the boundary cell 116 may include electrically conductive lines 502, 503 and contact structures 504 to 507. Contact structure 504 may provide an electrical connection between the wordline of the row 104 of the array 101 of memory cells at the end of which the boundary cell 116 is provided and the electrically conductive line 502. A portion of the electrically conductive line 502 outside the boundary cell 116 may provide a gate electrode of an access transistor of the memory cell adjacent the boundary cell 116. The portion of the electrically conductive line 502 within the boundary cell 116, contact structures 505, 506, 507, a semiconductor region 501 within the boundary cell 152 and the electrically conductive line 503 may be dummy structures which are provided for providing an environment of the memory cell adjacent the boundary cell 116 that is similar to the environment of memory cells within the array 101 of memory cells.

In FIG. 5, boundaries of the boundary cell 116 are denoted by lines 511, 512, 513, and line 514 denotes the boundary of the device 100.

The other boundary cells of the plurality of boundary cells 115 may have a configuration generally corresponding to the configuration of the boundary cell 116 described above. Directly adjacent ones of the boundary cells 115 may be mirror-symmetrical with respect to each other, with an axis of symmetry that is parallel to the row direction of the array 101 of memory cells. Additionally, there may be a mirror-symmetry between the boundary cells at opposite ends of the rows 102 to 105, with an axis of symmetry extending parallel to the column direction of the array 101 of memory cells.

The device 100 further includes corner cells 117, 118, 119, 120. The corner cells 117, 118 include an insulation region separating the boundary semiconductor regions 151, 152 and the P-doped semiconductor region 150, and the corner cells 119, 120 include a connection between the boundary semiconductor regions 151, 152 and the N-doped semiconductor region 149.

Figure 6:
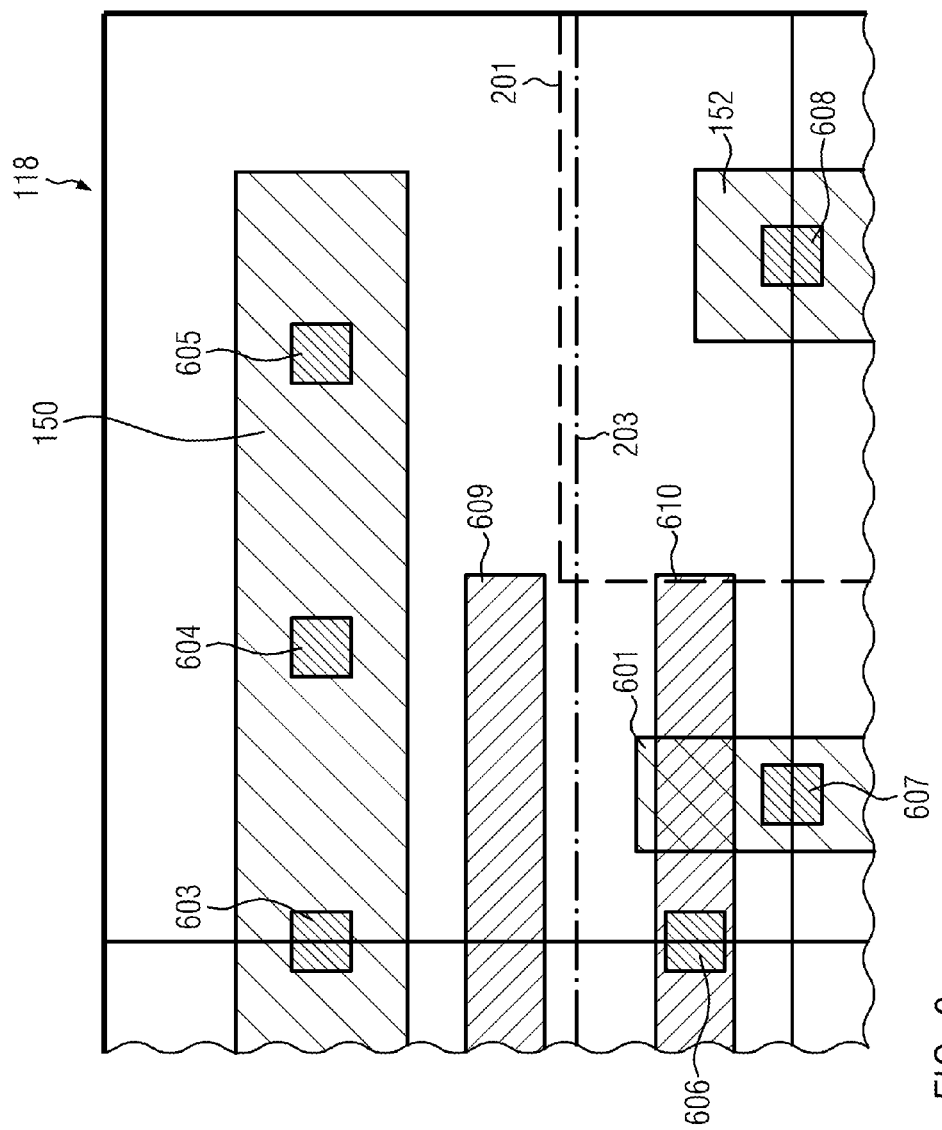
FIG. 6 shows a schematic enlarged view of a corner cell of a first type of the device shown in FIG. 1.

FIG. 6 shows a schematic enlarged view of the corner cell 118. The corner cell 118 includes a portion of the P-doped semiconductor region 150, contact structures 603, 604, 605 providing an electrical connection between the P-doped semiconductor region 150 and the low voltage power supply of the device 100, a portion of the boundary semiconductor region 152, a contact structure 608 providing an electrical connection between the boundary semiconductor region 152 and the high voltage power supply of the device 100. Additionally, the corner cell 118 includes electrically conductive lines 609, 610, a semiconductor region 601 and contact structures 606, 607, which may be dummy structures similar to those described above for the edge cells 111, 112 and the boundary cells 115.

Figure 7:
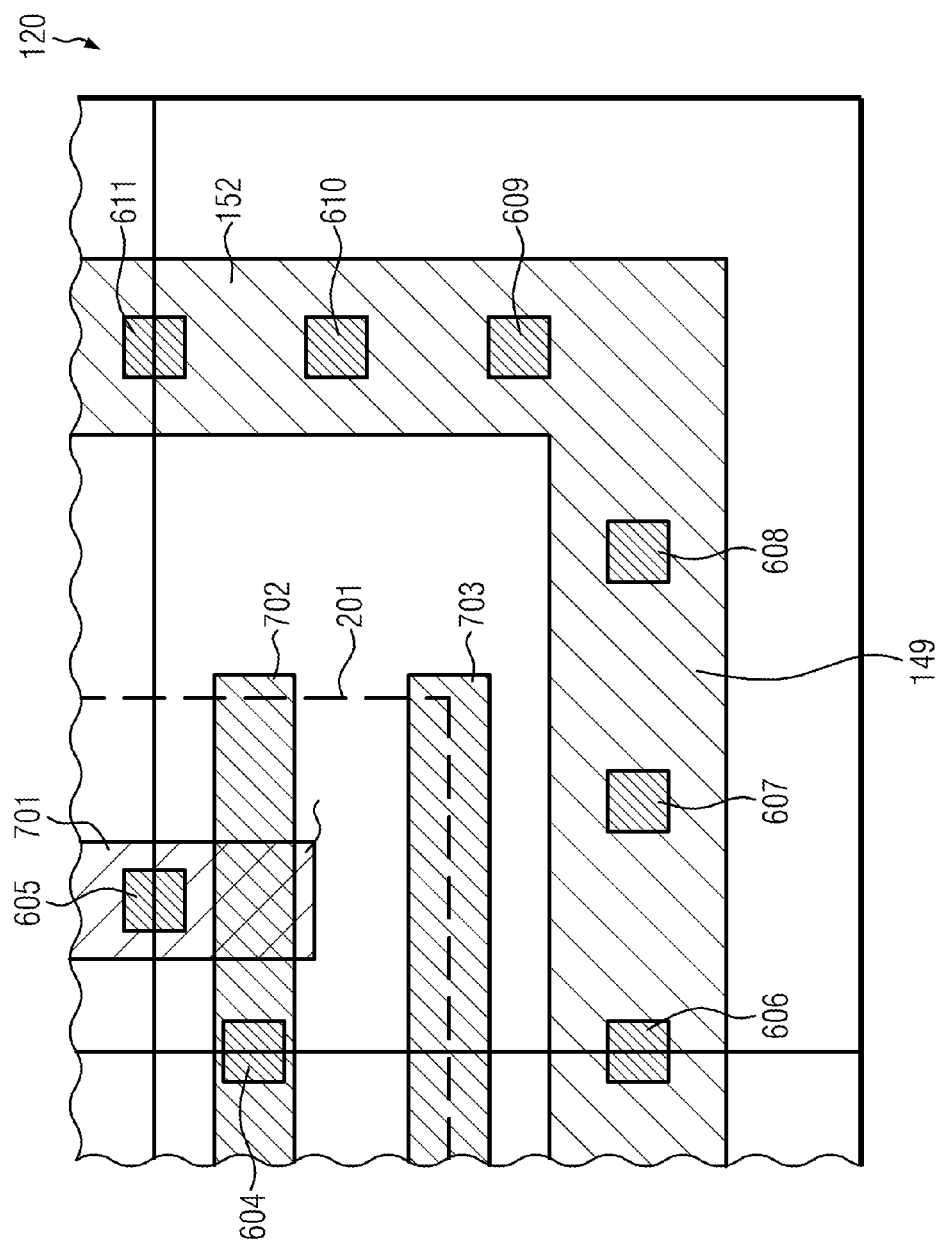
FIG. 7 shows a schematic enlarged view of a corner cell of a second type of the device shown in FIG. 1.

FIG. 7 shows a schematic enlarged view of the corner cell 120. The corner cell 120 includes portions of the n-doped semiconductor region 149 and the boundary semiconductor region 152, and contact structures 606 to 611 providing an electrical connection between the N-doped semiconductor region 149, the boundary semiconductor region 152 and the high voltage power supply of the device 100. Additionally, the corner cell 120 may include electrically conductive lines 702, 703, a semiconductor region 701 and contact structures 604, 605, which may be dummy structures similar to those described above.

The corner cells 117, 118 may be mirror-symmetrical with respect to each other, with an axis of symmetry parallel to the column direction of the array 101 of memory cells. Similarly, the corner cells 119, 120 may be mirror-symmetrical with respect to each other, with an axis of symmetry extending parallel to the column direction of the array 101 of memory cells.

The above-described features may be formed using conventional techniques for the formation of semiconductor structures. In particular, the N-well regions 131 to 134 and the P-well regions 123 to 130 may be formed by implanting ions of an N-type dopant and ions of a P-type dopant, respectively, into a semiconductor substrate on which the SRAM device 100 is to be formed. During the formation of the N-well regions 131 to 134, the portions of the substrate wherein the P-well regions 123 to 130 are formed may be covered by a photoresist mask, and the portions of the substrate wherein the N-well regions 131 to 134 are formed may be covered by a photoresist mask during the formation of the P-well regions 123 to 130.

Trench isolation structures providing electrical insulation between the semiconductor regions of the SRAM device 100 may be formed by means of techniques of forming shallow trench isolations including photolithography, etching, oxidation and/or deposition, and the gate insulation layers and the electrically conductive lines providing the gate electrodes of the transistors of the SRAM device 100 may be formed by processes of deposition, photolithography and etching.

Thereafter, ions of an N-type dopant and ions of a P-type dopant, respectively, may be implanted into the block-N regions and the block-P regions of the SRAM device 100, respectively, wherein the block-N regions may be covered by a photoresist mask during the formation of the block-P region, and the block-P region may be covered by a photoresist mask during the formation of the block-N region.

Then, one or more layers of an interlayer dielectric material, for example silicon dioxide and/or a low-k material, may be deposited over the substrate wherein the SRAM device 100 is to be formed, and the contact structures as well as electrically conductive metallization lines, which may include metallization lines providing electrical connections within the SRAM cells of the array 101 of SRAM cells, wordlines 137 to 140, bitlines 141 to 144, inverse bitlines 145 to 148 and power supply lines, may be formed by forming trenches and contact vias in the layer of interlayer dielectric and filling the trenches and contact vias with an electrically conductive metal.

The present disclosure is not limited to embodiments wherein each of the N-well regions 131 to 134 are electrically connected to the N-well contact area 121 at the same side of the device 100, and each of the P-well regions 123 to 130 is electrically connected to the P-well contact area 122 at the same side of the device 100. In other embodiments, a plurality of N-well contact areas and a plurality of P-well contact areas may be provided at each of a first side and a second side of an array of memory cells, the first and the second side being located at opposite ends of the columns of the array of memory cells, wherein, however, each of the N-well regions and the P-well regions is electrically contacted by an N-well contact area or a P-well contact area, respectively, at only one of the first and the second side. In such embodiments, the total number of the N-well and P-well contact areas may be smaller than two times the number of columns of the array of SRAM cells, so that the number of electrical insulations between the N-well contact areas and P-well contact areas may be reduced compared to conventional SRAM devices as described above. In the following, an example of such an embodiment will be described with reference to FIG. 8.

Figure 8:
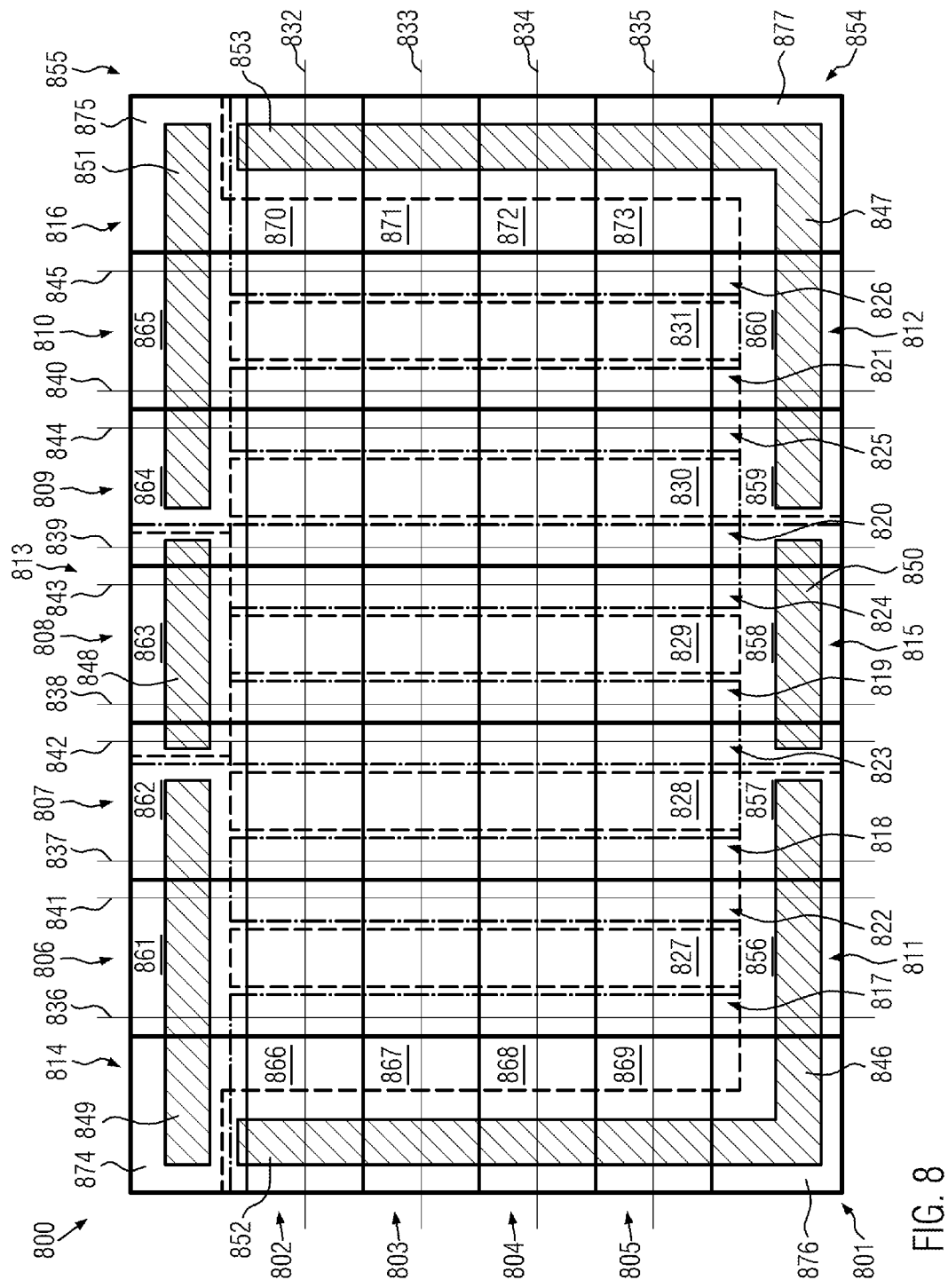
FIG. 8 schematically illustrates a device according to an embodiment.

FIG. 8 shows a schematic view of an SRAM device 800 according to an embodiment. SRAM device 800 includes an array 801 of memory cells, which may be SRAM cells. The memory cells of the array 801 are arranged in a plurality of rows 802 to 805 and a plurality of columns 806 to 810. Wordlines 832 to 835 extend along the rows 802 to 805 of the array 801 of memory cells. Bitlines 836 to 840 and inverse bitlines 841 to 845 extend along the columns 806 to 810 of the array 801 of memory cells.

Each of the columns 806 to 810 includes an N-well region. The N-well regions of the columns 806 to 810 are denoted by reference numerals 827 to 831. Furthermore, each of the columns 806 to 810 includes a first P-well region. In FIG. 8, the first P-well regions are denoted by reference numerals 817 to 821. Each of the columns 806 to 810 further includes a second P-well region. The second P-well regions are denoted by reference numerals 822 to 826. The N-well regions 827 to 831, first P-well regions 817 to 821 and second P-well regions 822 to 826 extend along the columns 806 to 810 of the array 801 of memory cells.

Features of the SRAM device 800, for example features of the memory cells thereof, as well as features of the wordlines, bitlines, inverse bitlines, N-well regions and P-well regions may correspond to those of the array 101 of memory cells described above with reference to FIGS. 1-7.

The device 800 further includes a plurality of N-well contact areas 811, 812, 813 and a plurality of P-well contact areas 814, 815, 816. N-well contact areas 811, 812 and P-well contact area 815 are provided at a first side 854 of the array 801 of memory cells. N-well contact area 813 and P-well contact areas 814, 816 are located at a second side 855 of the array 801 of memory cells that is opposite the first side 854.

The N-well contact area 811 may include an N-doped semiconductor region 846 that is in electrical connection with the N-well regions 827, 828 of columns 806, 807 of the array 801 of memory cells that are adjacent the N-well contact area 811. N-well contact area 813 includes an N-doped semiconductor region 848 that is in electrical connection with N-well region 829 of the column 808 of the array 801 of memory cells that is adjacent the N-well contact area 813. The N-well contact area 812 includes an N-doped semiconductor region 847 that is in electrical connection with N-well regions 830, 831 of the columns 809, 810 which are adjacent the N-well contact area 812.

Thus, each of the N-well regions 827, 828, 829, 830, 831 is electrically contacted at only one end thereof. N-well regions 827, 828, 830, 831 are electrically contacted at ends thereof on the first side 854 of the array 801 of memory cells, and N-well region 829 is contacted at an end thereof on the second side 855 of the array 801 of memory cells.

P-well contact area 814 may include a P-doped semiconductor region 849 that is in electrical contact with the first and the second P-well regions 817, 822 of column 806, and the first P-well region 818 of column 807. P-well contact area 815 includes a P-doped semiconductor region 850 that is in electrical contact with the second P-well region 823 of the column 807, the first P-well region 820 of the column 809, and both P-well regions 819, 824 of the column 808. P-well contact area 816 includes a P-doped semiconductor region 851 that is in electrical contact with the second P-well region 825 of column 809, and both P-well regions 821, 826 of column 810.

Thus, each of the P-well regions 817 to 826 is electrically contacted at only one end thereof, wherein the P-well regions 817, 822, 818, 825, 821, 826 are contacted at ends on the second side 855 of the array 801 of memory cells, and P-well regions 823, 819, 824, 820 are contacted at ends at the first side 854 of the array 801. Similar to the device 100 described above with reference to FIGS. 1-7, the device 800 may include boundary semiconductor regions 852, 853, which may be N-doped.

The present disclosure is not limited to embodiments wherein the device 800 includes five columns and four rows of memory cells, as shown in FIG. 8. In other embodiments, a greater or smaller number of rows and columns may be provided. Moreover, the number of N-well regions and P-well regions contacted by each of the N-well contact areas and P-well contact areas may be different from the embodiments shown in FIG. 8, and the number of N-well contact areas and P-well contact areas may be different. In some embodiments, each of the N-well contact areas and P-well contact areas may extend across two or more, three or more, five or more, or ten or more columns of the array 801 of memory cells. In other embodiments, smaller N-well and P-well contact areas extending across one or two of the columns of the array of memory cells may be provided. The extension of the N-well contact areas in the direction of the rows 802 to 805 of the array 801 of memory cells, in particular, the extension of the doped semiconductor regions provided therein, may be equal to or greater than at least one-half of the extension of each of the memory cells in the direction of the rows 802 to 805 of the array 801, two-thirds of the extension of each of the memory cells in the direction of the rows 802 to 805 of the array 801 and three-fourths of the extension of each of the memory cells in the direction of the rows 802 to 805 of the array 801.

For providing N-well contact areas 811, 812, 813, P-well contact areas 814, 815, 816, and boundary semiconductor regions 852, 853 as described above, edge cells 856 to 865, boundary cells 866 to 873 and corner cells 874, 875, 876, 877 may be used. The boundary cells 866 to 873 and the corner cells 874 to 877 may have a configuration corresponding to that of the boundary cells 115 and the corner cells 117 to 120 described above with reference to FIGS. 1-7. Edge cells 856, 860 and 863 may have a configuration corresponding to that of the first edge cells 111 described above with reference to FIGS. 1-7, and edge cells 861, 858, 865 may have a configuration corresponding to that of the second edge cells 112 described above. Additionally, edge cells 857, 859, 862, 864 may be provided, which include a trench isolation structure separating doped semiconductor regions of the contact areas that extend into the edge cells 857, 859, 862, 864. Further features of the edge cells 857, 859, 862, 864 may be similar to those of the first edge cells 111 and the second edge cells 112 described above.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A device, comprising:
   an array of a plurality of memory cells arranged in a plurality of rows and a plurality of columns, wherein each column comprises an N-well region and at least one P-well region, said N-well region and said at least one P-well region extending between a first end of the column and a second end of the column;
   at least one N-well contact area, each N-well contact area electrically contacting at least one of said N-well regions, wherein the N-well region of at least one of the columns is electrically contacted at only one of the first end and the second end of the column; and
   at least one P-well contact area, each P-well contact area electrically contacting at least one of said P-well regions, wherein each of the at least one P-well region of at least one of the columns is electrically contacted at only one of the first end and the second end of the column.

2. The device of claim 1, wherein each of said memory cells comprises a static random access memory cell.

3. The device of claim 2, further comprising a plurality of wordlines, each wordline extending along a respective one of the rows of said array of memory cells, a plurality of bitlines, each bitline extending along a respective one of the columns of said array of memory cells, and a plurality of inverse bitlines, each inverse bitline extending along a respective one of the columns of said array of memory cells.

4. The device of claim 3, wherein each of said N-well regions is electrically contacted by one or more of said at least one N-well contact area at a first side of said array of memory cells and wherein each of said P-well regions is electrically contacted by one or more of said at least one N-well contact area at a second side of said array of memory cells, said first and second sides being located at opposite ends of the columns of said array of memory cells.

5. The device of claim 4, wherein a single N-well contact area is provided at said first side of said array of memory cells and a single P-well contact area is provided at said second side of said array of memory cells, each N-well region being electrically contacted by said N-well contact area, each P-well region being electrically contacted by said P-well contact area.

6. The device of claim 5, further comprising:
   a plurality of first edge cells provided at said first side of said array of memory cells and a plurality of second edge cells provided at said second side of said array of memory cells;
   wherein each of said first edge cells comprises an N-doped semiconductor region that is in electrical contact with said N-well region of one of the columns of said array of memory cells adjacent the respective first edge cell, said at least one N-well contact area comprising said N-doped semiconductor region; and
   wherein each of said second edge cells comprises a P-doped semiconductor region that is in electrical contact with said at least one P-well region of one of the columns of said array of memory cells adjacent the respective second edge cell, said at least one P-well contact area comprising said P-doped semiconductor region.

7. The device of claim 6, wherein said N-doped semiconductor regions of said plurality of first edge cells form a contiguous N-doped semiconductor region, and wherein said P-doped semiconductor regions of said plurality of second edge cells form a contiguous P-doped semiconductor region.

8. The device of claim 7, wherein each of said first edge cells further comprises one or more first contact structures providing an electrical connection to said N-doped semiconductor region of the respective first edge cell, and wherein each of said second edge cells further comprises one or more second contact structures providing an electrical connection to said P-doped semiconductor region of the respective second edge cell.

9. The device of claim 8, further comprising a first and a second N-doped boundary semiconductor region provided at a third side and a fourth side of said array of memory cells, said third and fourth sides being located at opposite ends of the rows of said array of memory cells.

10. The device of claim 9, wherein each of said first and second edge cells further comprises one or more electrically conductive lines of an electrically conductive material.

11. The device of claim 3, wherein one or more N-well contact areas and one or more P-well contact areas are provided at each of a first side and a second side of said array of memory cells, said first and the second sides being located at opposite ends of the columns of said array of memory cells.

12. The device of claim 11, wherein an extension of each of said N-well contact areas in a direction of the rows of said array of memory cells and an extension of each of said P-well contact areas in the direction of the rows of said array of memory cells are equal to or greater than at least one of one half of an extension of each of the memory cells in the direction of the rows of said array of memory cells, two thirds of the extension of each of the memory cells in the direction of the rows of said array of memory cells, and three quarters of the extension of each of the memory cells in the direction of the rows of said array of memory cells.

13. A method, comprising:
   forming an array of a plurality of memory cells arranged in a plurality of rows and a plurality of columns, wherein each column comprises an N-well region and at least one P-well region, said N-well region and said at least one P-well region extending between a first end of the column and a second end of the column;
   forming at least one N-well contact area, each N-well contact area electrically contacting at least one of said N-well regions, wherein the N-well region of at least one of the columns is electrically contacted at only one of said first end and said second end of the column; and forming at least one P-well contact area, each P-well contact area electrically contacting at least one of said P-well regions, wherein each of said at least one P-well region of at least one of the columns is electrically contacted at only one of said first end and said second end of the column.

14. The method of claim 13, wherein a single N-well contact area is formed at a first side of said array of memory cells and a single P-well contact area is formed at a second side of said array of memory cells, said first and second sides being at opposite ends of the columns of said array of memory cells.

15. The method of claim 14, wherein the formation of said N-well contact area comprises:
performing a first ion implantation process wherein an N-type dopant is implanted into a first semiconductor region adjacent said array of memory cells; and
forming a plurality of first contact structures providing an electrical connection to said first semiconductor region.

16. The method of claim 15, wherein the formation of said array of memory cells comprises forming a plurality of N-channel transistors in each of said p-well regions and wherein, in said first ion implantation process, ions of said N-type dopant are implanted into the source and drain regions of said N-channel transistors.

17. The method of claim 16, wherein the formation of said at least one P-well contact area comprises:
performing a second ion implantation process wherein a P-type dopant is implanted into a second semiconductor region adjacent said array of memory cells; and
forming a plurality of second contact structures providing an electrical connection to said second semiconductor region.

18. The method of claim 17, wherein the formation of said array of memory cells comprises forming a plurality of P-channel transistors in each of said N-well regions, and wherein, in said second ion implantation process, ions of said P-type dopant are implanted into source and drain regions of said P-channel transistors.

19. The method of claim 18, wherein the formation of said array of memory cells comprises forming a static random access memory cell in each of the memory cells.

20. A device, comprising:
an array of a plurality of static random access memory cells arranged in a plurality of rows and a plurality of columns, wherein each column comprises an N-well region, a first P-well region and a second P-well region, said first and second P-well regions being arranged on opposite sides of said N-well region and spaced apart along a direction of the rows of said array;
an N-well contact area provided at a first end of the columns of said array, said N-well contact area comprising a contiguous N-doped semiconductor region;
a P-well contact area provided at a second end of the columns of said array, said P-well contact area comprising a contiguous P-doped semiconductor region;
wherein said N-well region of each of the columns of said array is electrically connected to said N-well contact area; and
wherein said first P-well region and said second P-well region of each of the columns of said array are electrically connected to said P-well contact area.

* * * * *